(12) United States Patent
Jagannathan et al.

(10) Patent No.: US 11,196,411 B2
(45) Date of Patent: Dec. 7, 2021

(54) PROTECTION CIRCUIT

(71) Applicant: NXP USA, INC., Austin, TX (US)

(72) Inventors: Srikanth Jagannathan, Austin, TX (US); Kumar Abhishek, Bee Cave, TX (US)

(73) Assignee: NXP USA, Inc., Austin, TX (US)

( * ) Notice: Subject to any disclaimer, the term of this patent is extended or adjusted under 35 U.S.C. 154(b) by 386 days.

(21) Appl. No.: 16/270,002

(22) Filed: Feb. 7, 2019

(65) Prior Publication Data

US 2020/0259487 A1    Aug. 13, 2020

(51) Int. Cl.
*H03K 17/08* (2006.01)
*H02H 1/00* (2006.01)
*H02H 9/04* (2006.01)

(52) U.S. Cl.
CPC .......... *H03K 17/08* (2013.01); *H02H 1/0007* (2013.01); *H02H 9/04* (2013.01)

(58) Field of Classification Search
CPC ............. H03K 17/08; H03K 19/00315; H02H 1/0007; H02H 9/04
USPC .................................................. 361/91.1, 86
See application file for complete search history.

(56) References Cited

U.S. PATENT DOCUMENTS

| | | | |
|---|---|---|---|
| 5,977,796 A | 11/1999 | Gabara | |
| 6,362,942 B2 | 3/2002 | Drapkin et al. | |
| 6,667,650 B2 | 12/2003 | Gammie et al. | |
| 7,012,450 B1 | 3/2006 | Oner et al. | |
| 7,498,864 B2 * | 3/2009 | Grover | H03K 17/0822 327/525 |
| 7,564,270 B1 | 7/2009 | Zhang et al. | |
| 9,929,142 B2 | 3/2018 | Ivanov et al. | |
| 9,979,183 B2 | 5/2018 | Oliver et al. | |
| 10,794,982 B2 * | 10/2020 | Newlin | G01R 19/32 |
| 2007/0229141 A1 * | 10/2007 | Grover | H03K 17/0822 327/427 |
| 2012/0236456 A1 * | 9/2012 | Yu | H05B 47/28 361/91.1 |
| 2013/0120891 A1 * | 5/2013 | Truong | H02M 1/32 361/93.9 |

* cited by examiner

*Primary Examiner* — Dharti H Patel

(57) ABSTRACT

A circuit including a device including a first and second node. The device operating in at least an enabled mode and a disabled mode. The circuit including a voltage control circuit. The voltage control circuit including a current source for sourcing current to or sinking current from the first node during the disabled mode and a voltage difference detector including an output for providing an indication of a measured voltage difference between the first node and the second node. The voltage control circuit includes a current source control circuit including a first input to receive the indication of the measured voltage difference and an output to control current sourced to or sinked from the first node by the current source to limit a voltage difference between the first and second node based on a comparison between the indication of the measured voltage difference and an indication of a target voltage difference.

20 Claims, 5 Drawing Sheets

PROTECTION CIRCUIT

BACKGROUND

Field

This disclosure relates generally to integrated circuits, and more specifically, to a protection circuit for a disabled device.

Related Art

The Safe Operating Area (SOA) of a transistor describes the maximum voltages across any two terminals of the transistor for the transistor to maintain reliable operation. In some cases, transistors rated for lower voltages, referred to as low voltage (LV) devices or transistors, are used in high voltage domains, typically when high speed and low area are required. In this situation, there are possibilities that SOA violations occur on the LV transistors.

For example, a transmitter (TX) output stage has a high current demand (about 10 mA for a 5 Gps transmitter), and thus requires transistors rated for higher voltages, referred to as high voltage (HV) devices or transistors. However, if HV transistors were used for every transistor in the transmitter output stage, the required circuit area would be much too high. Therefore, LV transistors are used in combination with HV transistors to save area. In certain situations, these LV transistors become susceptible to SOA violations, which can result in permanent damage. For example, when the transmitter output stage is off, the leakage currents within the transmitter may inadvertently cause SOA violations in the LV transistor.

One current solution uses a resistor divider to generate appropriate biases at nodes of these LV transistors in order to compensate for leakage through the output stage. However, such resistor dividers need to provide a high enough drive to compensate for the leakage current and a low enough drive to support standby operation. Typically, such a voltage divider that provides sufficient current to compensate for the leakage current violates the specifications required for standby operation. Therefore, a need exists for improved protection against SOA violations for LV transistors used in high speed and high current applications.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an LV transistor having a first current electrode coupled to a first node and a second current electrode coupled to a second node is protected by a protection circuit which controls the voltage difference between the first and second nodes in order to prevent SOA violations on the LV transistor. For example, the protection circuit includes a voltage difference detector which measures the voltage difference between the first and second node, and current source control circuit which, based on a comparison between the measured voltage difference and a target voltage difference, enables a current source to either increase or decrease a voltage at either the first or second node, as needed, to ensure the measured voltage difference stays within the target voltage difference. This target voltage difference may be set to a value that is less than the SOA limit, so that the voltage across the transistor does not reach a damaging level.

Figure 1:
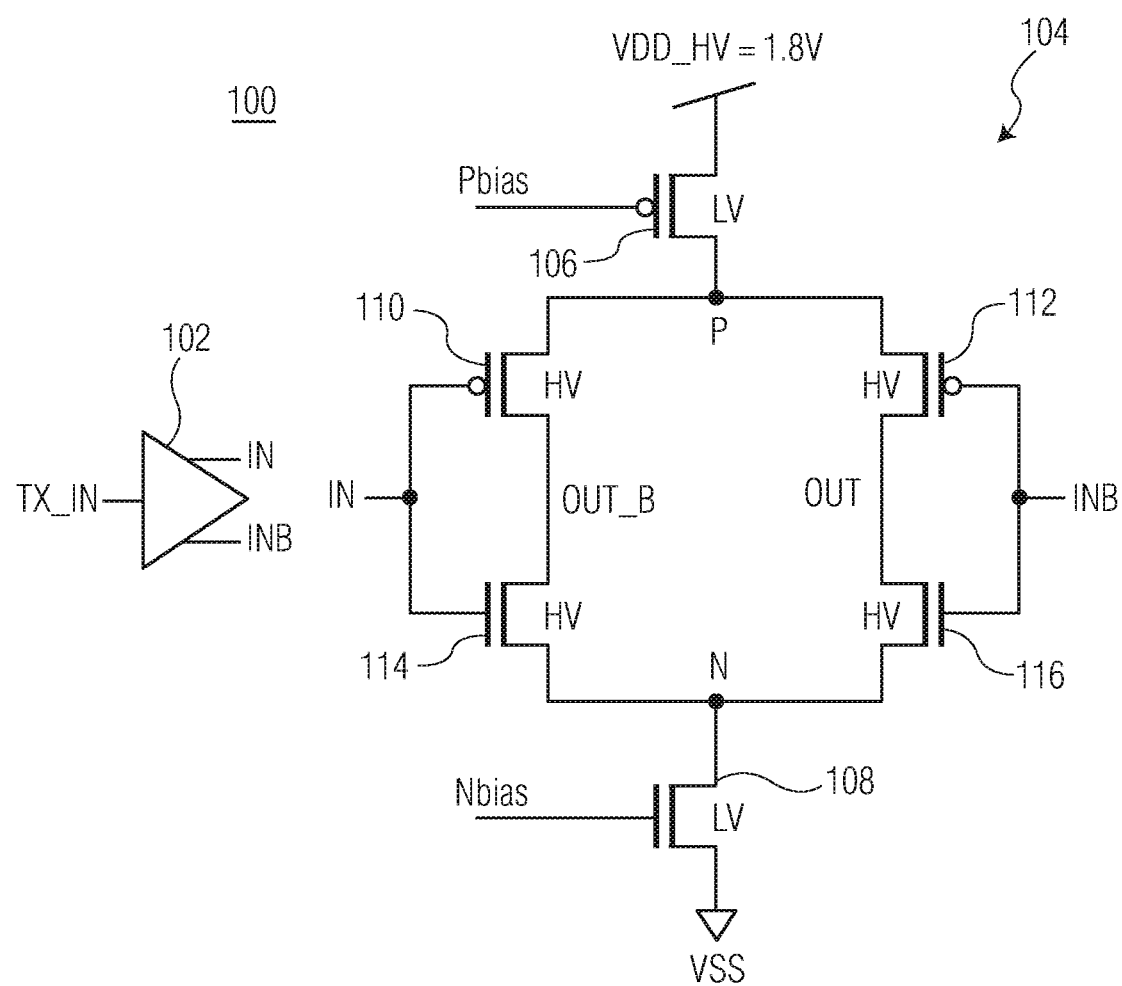
FIG. 1 illustrates, in partial schematic and partial block diagram form, a transmitter in accordance with one embodiment of the present invention.

FIG. 1 illustrates, in partial block diagram and partial schematic form, a transmitter (TX) 100 in accordance with one embodiment of the present invention. TX 100 includes an input stage 102 coupled to an output stage 104. Input stage 102 includes an amplifier coupled to receive an input signal, TX_IN, and coupled to provide a differential output, IN and INB, to output stage 104. Output stage 104 receives IN and INB and provides differential outputs, OUT and OUT_B. Output stage 104 includes an LV P-type Metal-Oxide-Semiconductor Field Effect Transistor (PMOS) transistor 106, an LV N-type Metal-Oxide-Semiconductor Field Effect Transistor (NMOS) transistor 108, HV PMOS transistors 110 and 112, and HV NMOS transistors 114 and 116. Note that in the illustrated embodiment, the differential signal from the amplifier of input stage 102 is provided directly to output stage 104. However, in alternate embodiments, one or more additional stages may be present between the input and output stages, in which IN and INB provided to output stage 104 correspond to the differential outputs from the stage immediately preceding output stage 104.

In output stage 104, a first current electrode of PMOS transistor 106 has a first current electrode coupled to a first power supply terminal, e.g., VDD_HV, a second current electrode coupled to a first circuit node, P, and a control electrode coupled to receive a first bias signal, Pbias. HV PMOS transistor 110 has a first current electrode coupled to node P and a control electrode coupled to receive IN. HV NMOS transistor 114 has a first current electrode coupled to a second current electrode of HV PMOS 110, a control electrode also coupled to receive IN, and a second control electrode coupled to a second internal circuit node, N. HV PMOS transistor 112 has a first current electrode of is coupled to node P and a control electrode coupled to receive INB. HV NMOS transistor 116 has a first current electrode coupled to a second current electrode of HV PMOS transistor 112, a control electrode coupled to receive INB, and a second current electrode coupled to node N. LV transistor 108 has a first current electrode coupled to node N, a control electrode coupled to receive a second bias signal, Nbias, and a second current electrode coupled to a second power supply terminal, e.g., VSS. The second current electrode of transistor 112 and the first current electrode of transistor 116 provides OUT, and the second current electrode of transistor 110 and the first current electrode of transistor 114 provides OUT_B. Note that transistors 110 and 114 form a first inverter, receiving IN at an input and providing OUT_B at an output, and transistors 112 and 116 form a second inventor, receiving INB at an output and providing OUT at an output. As used here, the first power supply terminal will be referred to as VDD_HV and the second power supply terminal as VSS. As an example, VDD_HV provides 1.8V, and VSS provides 0V.

In operation, transmitter 100 receives TX_IN and converts this signal into a differential and amplified output, OUT and OUT_B. Transmitter 100 is designed such that, during operation when transmitter 100 is enabled, the voltage over any two terminals of LV PMOS 106 or LV NMOS 108 do not exceed the SOA limit (which may be 0.9V in one example). However, when transmitter 100 is disabled and transmitter 100 is placed in a safe state, the leakage currents can cause nodes P and N to float to values which will result in violating the SOA limits of the transistors which can result in permanent transistor damage. For example, when transmitter 100 is disabled, Pbias can be set to a high voltage, such as VDD_HV, so as to turn off LV PMOS 106, and Nbias can be set to VSS so as to turn off LV NMOS 108. Also, in the safe state, IN can be set to the same voltage as Pbias and INB can be set to VSS. This results in turning off transistors 110 and 116 and turning on transistors 112 and 114.

With this safe state configuration, nodes P and N are left floating and will float to voltage values based on the leakage of LV transistors 106 and 108, which are coupled in series between the first and second power supply terminals. Due to other circuitry of transmitter 100 (not illustrated), a discharge path exists from VDD_HV to VSS, through transistors 106 and 108. Leakage current through PMOS transistor 106 causes the voltage at node P to move closer to VDD_HV and the leakage current through NMOS transistor 108 causes the voltage at node N to move closer to VSS. If the leakage current of transistor 108 dominates (i.e. is leakier than transistor 106), the voltage at node N is pulled down faster towards VSS. As a result, the voltage on node P decreases, causing the voltage over transistor 106 (corresponding to the difference between VDD_HV and the voltage at node P) to increase. If, for example, the voltage at node P falls below 0.9V, the voltage over transistor 106 exceeds the SOA limit of 0.9V (assuming 1.8V for VDD_HV). If, on the other hand, the leakage current of transistor 106 dominates (i.e. is leakier than transistor 108), the voltage at node P is pulled up faster towards VDD_HV. As a result, the voltage on node N increases, causing the voltage over transistor 108 (corresponding to the difference between the voltage at node N and VSS) to also increase. If, for example, the voltage at node N rises above 0.9V, the voltage over transistor 108 exceeds the SOA limit of 0.9V.

In order to prevent the floating nodes P and N from causing violations of the SOA limits of LV transistors 106 and 108, protection circuits (also referred to as voltage control circuits) are used to protect the LV transistors while transmitter 100 is disabled. Transistor 106 is protected by sourcing current to node P, when needed, to raise the voltage at node P and prevent the voltage over transistor 106 from exceeding its SOA limit. Similarly, transistor 108 is protected by sinking current from node N, when needed, to lower the voltage at node N and prevent the voltage over transistor 108 from exceeding its SOA limit. Protection circuits can be coupled to node P and to node N so as to protect transistor 106 and 108, respectively. In one embodiment, a protection circuit monitors the voltage over a device to be protected (e.g. transistor 106 or 108) and, based on the monitored voltage, controls a current sourced to or sinked from a node of the transistor being protected (e.g. node P or node N, respectively) to ensure that the voltage over the transistor being protected does not exceed the SOA limit.

Figure 2:
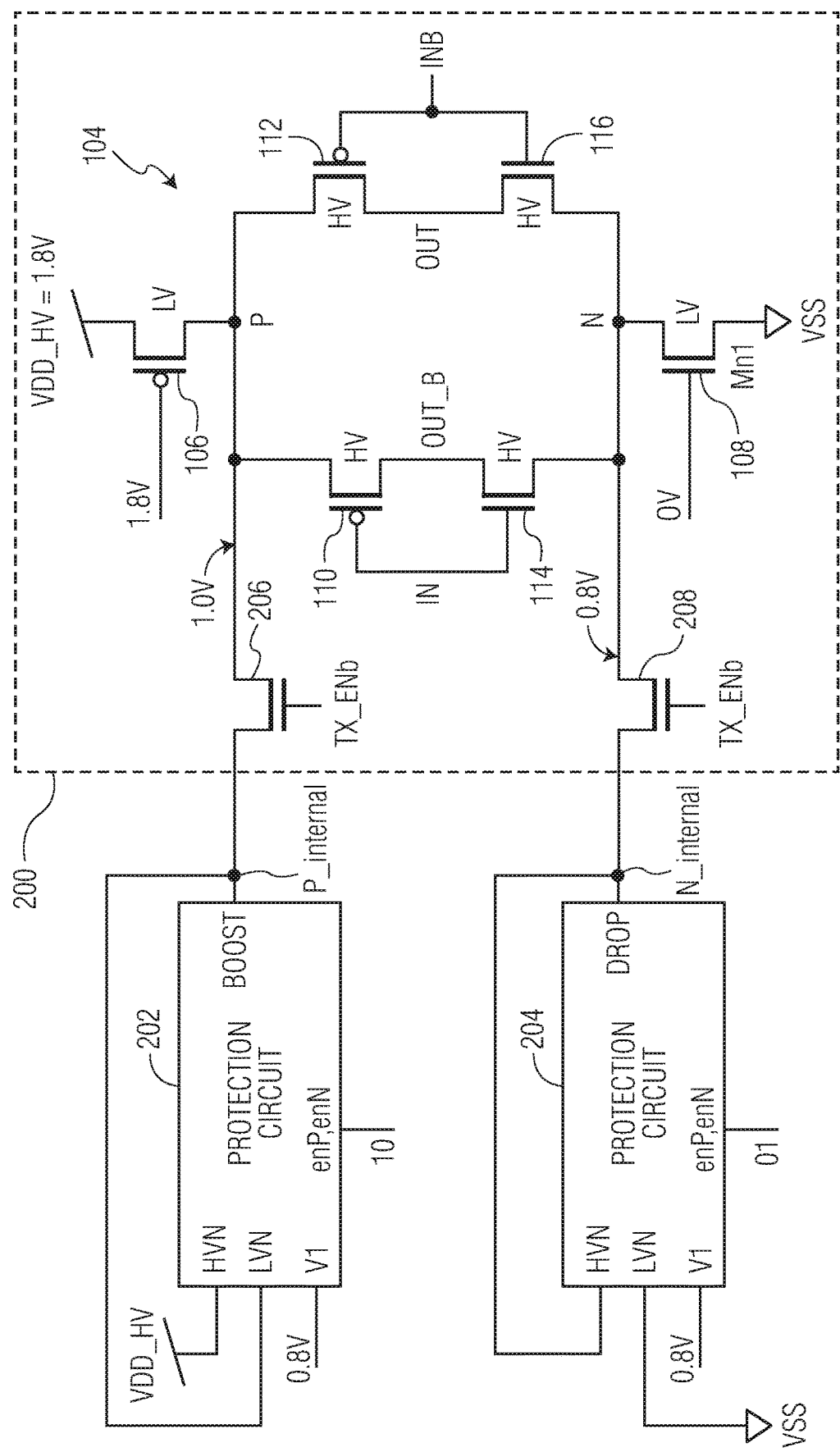
FIG. 2 illustrates, in partial schematic and partial block diagram form, a transmitter output stage of the transmitter of FIG. 1 and protection circuits coupled to the transmitter output stage, in accordance with one embodiment of the present invention.

FIG. 2 illustrates, in partial schematic and partial block diagram form, a transmitter circuit 200 including output stage 104 of FIG. 1, switches 206 and 208, and protection circuits 202 and 204, in accordance with one embodiment of the present invention. Note that transmitter circuit 200 is a simplified representation of a transmitter circuit and may include additional circuitry, such as, for example, input stage 102 of FIG. 1 or other additional stages or circuitry, as needed. Protection circuit 202 includes a first input corresponding to a higher voltage node (HVN), a second input corresponding to a lower voltage node (LVN), a third input corresponding to a target voltage difference (V1), enable inputs enP and enN, and a boost circuit node. Protection circuit 204 includes a first input corresponding to a higher voltage node (HVN), a second input corresponding to a lower voltage node (LVN), a third input corresponding to a target voltage difference (V1), enable inputs enP and enN, and a drop circuit node. Switch 206 is implemented as an NMOS transistor and has a first current electrode coupled to the boost output of protection circuit 202 (at circuit node P_internal), a second current electrode coupled to node P, and a control electrode coupled to receive TX_ENb, which corresponds to the complement of the transmitter enable signal, TX_EN. Switch 208 is implemented as an NMOS transistor and has a first current electrode coupled to the drop output of protection circuit 204 (at a circuit node N_internal), a second current electrode coupled to node N, and a control electrode coupled to receive TX_ENb. When transmitter 100 is enabled, TX_EN is a logic level one and therefore, TX_ENb is a logic level zero, which turns off transistors 206 and 208 such that protection circuit 202 is disconnected from node P and protection circuit 204 is disconnected from node N. When transmitter 100 is disabled, though, TX_EN is a logic level zero, and TX_ENb is a logic level high. In this case, transistors 206 and 208 are on such that protection circuit 202 is connected to node P and protection circuit 204 is connected to node N.

Figure 3:
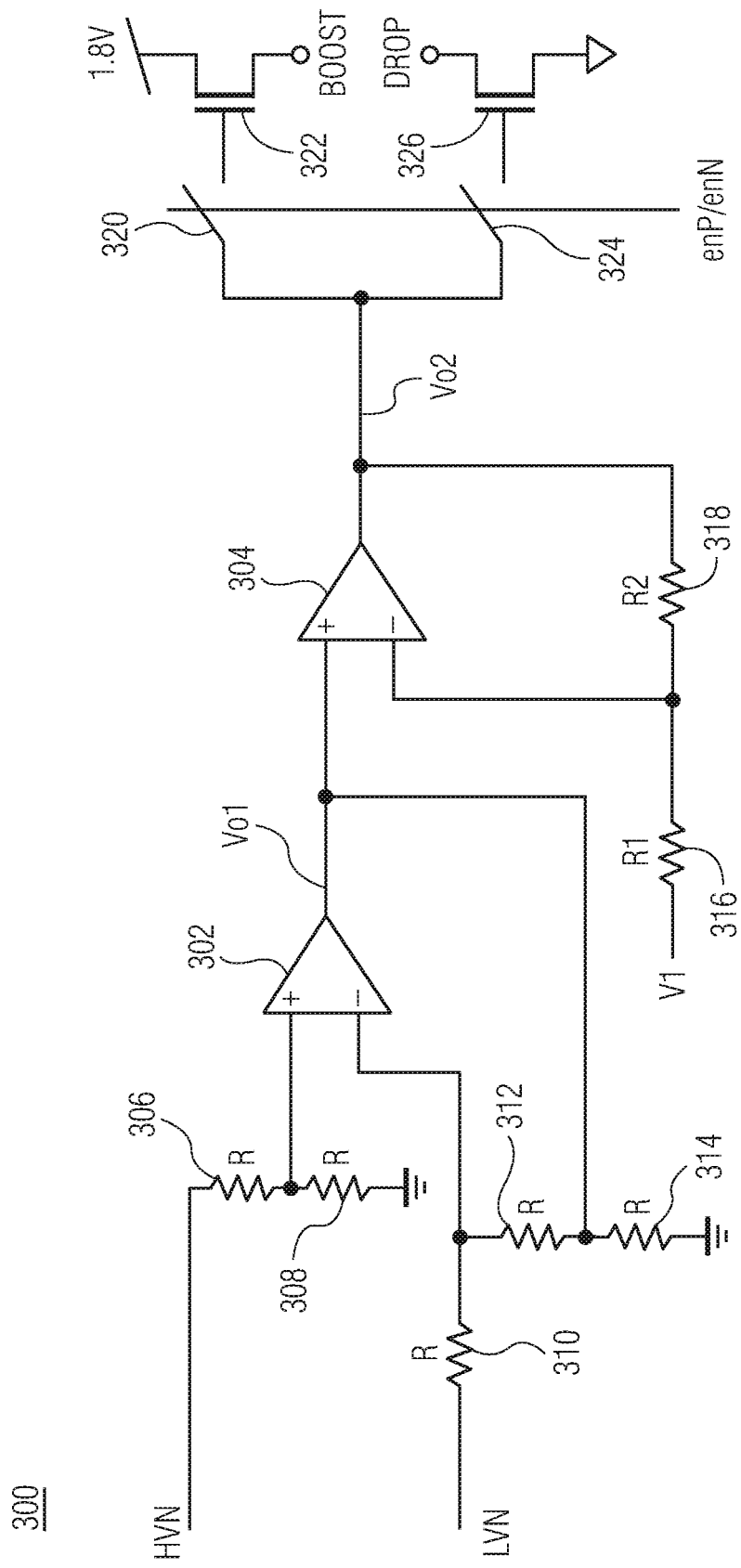
FIG. 3 illustrates, in schematic form, a protection circuit in accordance with one embodiment of the present invention.

FIG. 3 illustrates, in partial schematic and partial block diagram form, a protection circuit 300 having inputs HVN, LVN, V1, and enP/enN, and having boost and drop circuit nodes. Protection circuits 202 and 204 of FIG. 2 may each be implemented with protection circuit 300. Protection circuit 300 includes comparators 302 and 304, resistors R 306, 308, 310, 312, 314, resistor R1 316, resistor R2 318, switches 320 and 324, and NMOS transistors 322 and 326. Note that each of NMOS transistors 322 and 326 operate as current sources and may therefore also be referred to as current sources 322 and 326, respectively. A first terminal of resistor R 306 is coupled to input HVN, and a second terminal of resistor R 306 is coupled to a non-inverting input of comparator 302. A first terminal of resistor R 308 is coupled to the second terminal of resistor R 306 and to the non-inverting input of comparator 302, and a second terminal of resistor R 308 is coupled to VSS. A first terminal of resistor R 310 is coupled to input LVN, and a second terminal of resistor R 310 is coupled to an inverting input of comparator 302. A first terminal of resistor R 312 is coupled to the second terminal of resistor R 310 and to the inverting input of comparator 302. A second terminal of resistor R 312 is coupled to an output of comparator 302, in which the output of comparator 302 provides a first output voltage, Vo1. A first terminal of resistor R 314 is coupled to the second terminal of resistor R 312, and a second terminal of resistor R 314 is coupled to VSS.

The output of comparator 302 is coupled to a non-inverting input of comparator 304. A first terminal of resistor R1 316 is coupled to input V1, and a second terminal of resistor R1 316 is coupled to an inverting input of comparator 304. A first terminal of resistor R2 318 is coupled to the second terminal of resistor R1 316 and to the inverting input of comparator 304. A second terminal of resistor R2 318 is coupled to an output of comparator 304. The output of comparator 304 provides a second output voltage, Vo2, and is coupled to first current terminals of switches 320 and 324. A first current electrode of transistor 322 is coupled to VDD_HV, a control electrode of transistor 322 is coupled to a second current terminal of switch 320, and a second current electrode of transistor 322 is coupled to the boost circuit node. A control input of switch 320 is coupled to input enP. A first current electrode of transistor 326 is coupled to the drop circuit node, a control electrode of transistor 326 is coupled to a second current terminal of switch 324, and a second current electrode of transistor 326 is coupled to VSS. A control input of switch 324 is coupled to input enN. In the illustrated embodiment of FIG. 3, resistors R each have a resistance value of R, resistor R1 has a resistance value of R1, and resistor R2 has a value of R2. In one embodiment, R1=R2, but alternately, they may be different. R1 and R2 may be the same or different than R. Also, protection circuit 300 may also be referred to as a voltage control circuit.

In operation, when switch 320 is closed (i.e. on or in a conductive state), transistor 322 is a current source which sources current to the boost circuit node, and when switch 324 is closed (i.e. on or in a conductive state), transistor 326 operates as a current source which sinks current from the drop circuit node. As will be described in reference to FIGS. 2 and 4, the boost circuit node is typically connected to the same circuit node as one of HVN or LVN, depending on which circuit node needs an additional boost current to increase the voltage. Similarly, the drop circuit node is typically connected to the same circuit node as one of HVN or LVN, depending on which circuit node needs a drop in current to decrease the voltage. Furthermore, based on whether voltage needs to be increased, decreased, or both, switches 320 and 324 are controlled accordingly, by the the control signals enP and enN. In the illustrated embodiment, enP controls switch 320, such that switch 320 is closed when enP is asserted, and enN controls switch 324, such that switch 324 is closed when enN is asserted. Note that, depending on the embodiment, only enP may be asserted if only an additional boost current is needed, only enN may be asserted if only a drop in current is needed, or both may be asserted if both an additional current is needed for one node and a drop in current is needed at another node, Referring to FIG. 3, comparator 302, along with resistors 306, 308, 310, 312, and 314, operate as a voltage detector, in which output Vo1 indicates a measured voltage difference between HVN and LVN. Therefore, HVN and LVN can be connected to the current electrodes of a transistor being protected by protection circuit 300, in which HVN corresponds to the current electrode that is at the higher voltage and LVN corresponds to the current electrode that is at the lower voltage. Comparator 304, along with resistors 316 and 318, operates as a current source control circuit which is coupled to receive the measured voltage difference between HVN and LVN (corresponding to Vo1) and provides Vo2 to control current sources 322 or 326 or both based on comparing Vo1 to the target voltage difference V1. As will be described in reference to FIG. 2, this current source control circuit limits the voltage difference between HVN and LVN to within the target voltage difference V1 so as to prevent damage to the transistor being protected.

Referring to the operation of FIG. 2, LV PMOS device 106 and LV NMOS device 108 are protected by protection circuits 202 and 204, respectively, in which each of protection circuits 202 and 204 can be implemented as illustrated in FIG. 3. Protection circuit 202 provides protection to transistor 106 by controlling node P so that a voltage across transistor 106 does not exceed the SOA limit. Protection circuit 204 provides protection to transistor 108 by controlling node N so that a voltage across transistor 108 does not exceed the SOA limit.

Transistor 106 is connected between VDD_HV and node P, therefore, for protection circuit 202, HVN is connected to VDD_HV and LVN is connected to the circuit node P_internal. P_internal is coupled to node P via switch 206 such that when transmitter 104 is disabled and protection of transistor 106 is needed due to leakage currents, LVN is connected to node P via node P_internal and switch 206. In the example of FIG. 2, in which the SOA limit of transistor 106 is 0.9V, V1 is coupled to receive 0.8V (which is safe voltage because it is less 0.9V). As described above, V1 corresponds to the maximum voltage difference between HVN and LVN allowable by protection circuit 202 and thus is referred to as the target voltage difference.

When transmitter 104 is disabled, due to leakage currents, the voltage at node P may decrease which can cause the voltage over transistor 106 to surpass the SOA limit. However, protection circuit 202 measures the voltage difference, Vo1, between HVN and LVN (corresponding the voltage difference between VDD_HV and node P) and, based on that measured voltage, controls current source 322 (which is enabled by enP being asserted, as indicated by the 0b10 provided to enP/enN inputs, in which "0b" preceding a value indicates a binary value). When the Vo1 goes above the target voltage difference, V1, comparator 304 asserts Vo2 to turn on current source 322, which provides current to the boost node (also coupled to node P via circuit node P_internal and switch 206). By current source 322 sourcing current to node P, the voltage at node P rises. In the illustrated embodiment, the design of current source 322 is such that, when on, causes node P to rise to 1.0V. This ensures that the voltage over transistor 106 (the voltage between VDD_HV and node P) does not surpass V1 (0.8V in this example). Note that when the voltage at node P rises to a point at which the measured voltage difference, Vo1, is no longer greater than V1, comparator Vo2 turns off current source 322.

Protection circuit 204 works in a similar manner to control node N so as to protected transistor 108. Transistor 108 is connected between node N and node VSS, therefore for protection circuit 204, LVN is connected to VSS and HVN is connected to a circuit node N_internal. N_internal is coupled to node N via switch 208 such that when transmitter 104 is disabled and protection of transistor 108 is needed due to leakage currents, HVN is connected to node N via node N_internal and switch 208. In the example of FIG. 2, in which the SOA limit of transistor 108 is 0.9V, V1 is coupled to receive 0.8V (which is less than 0.9V). As described above, V1 of protection circuit 204 corresponds to the maximum voltage difference between HVN and LVN allowable by protection circuit 204 and thus is referred to as the target voltage difference.

When transmitter 104 is disabled, due to leakage currents, the voltage at node N may increase which can cause the voltage over transistor 108 to surpass the SOA limit. However, protection circuit 204 measures the voltage difference, Vo1, between HVN and LVN (corresponding the voltage difference between node N and VSS) and, based on that measured voltage, controls current source 326 (which is enabled by enN being asserted, as indicated by the 0b01 provided to enP/enN inputs). When the Vo1 goes above the target voltage difference, V1, comparator 304 asserts Vo2 to turn on current source 326, which sinks current from the drop node (also coupled to node N via circuit node N_internal and switch 208). By current source 326 sinking current from node N, the voltage at node N falls. In the illustrated embodiment, the design of current source 326, when on, causes node N to fall to 0.8V. This ensures that the voltage over transistor 108 (the voltage between node N and VSS) does not surpass V1 (0.8V in this example). Note that when the voltage at node N falls to a point at which the measured voltage difference, Vo1, is no longer greater than V1, comparator Vo2 turns off current source 326.

Figure 4:
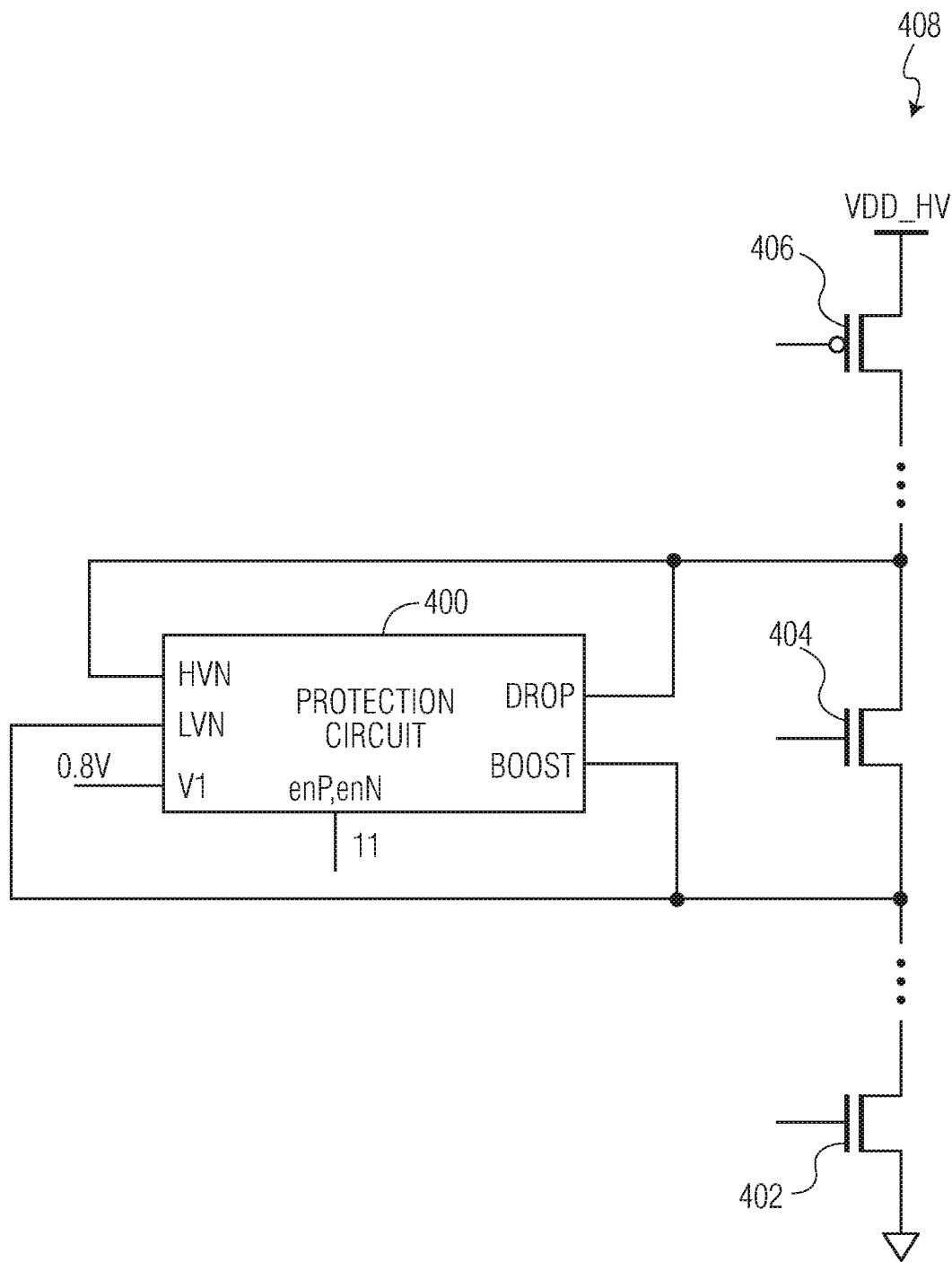
FIG. 4 illustrates, in partial block diagram and partial schematic form, a protection circuit coupled to stacked devices, in accordance with one embodiment of the present invention.

FIG. 4 illustrates, in partial block diagram and partial schematic form, a protection circuit 400 coupled to a transistor within stacked transistors 408, in accordance with one embodiment of the present invention. Stacked transistors 408 include PMOS transistor 406, NMOS transistors 404, and NMOS transistor 402, all coupled in series between VDD_HV and VSS. Similar to transmitter 104, when disabled, stacked transistors 408 are also susceptible to leakage currents. The voltages on the first and second current electrodes of transistor 404 may, due to the leakage currents, spread too far apart, causing a voltage drop over transistor 404 that violates the SOA limit. In this embodiment, protection circuit 400, which may be implemented as protection circuit 300 of FIG. 3, is connected to transistor 404 to provide protection. The HVN input of protection circuit 400 is connected to the first current electrode of transistor 404, and the LVN input of protection circuit 400 is connected to the second current electrode of transistor 404. The drop circuit node of protection circuit 400 is connected to the first current electrode of transistor 404 to reduce the voltage at that node, as needed, and the boost circuit node of protection circuit 400 is connected to the second current electrode of transistor 404 to increase the voltage at the node. Also, enP and enN are set to 0b11 to close both switches 320 and 324 of protection circuit 300.

In operation, protection circuit 400 controls the voltage across transistor 404 based on the voltage difference across transistor 404. That is, when the measured voltage difference Vo1 between HVN and LVN (which corresponds to the voltage difference across transistor 404) exceeds V1 (the target voltage difference), Vo2 at the output of comparator 304 inside protection circuit 400 causes current source 322 to sink current from the first current electrode of transistor 404 and current source 324 to source current to the second current electrode of transistor 404. This reduces the voltage difference across transistor 404. When the voltage difference falls back below V1, comparator 304 stops current sources 322 and 326 from sinking/sourcing current. In this manner, transistor 404 is protected by preventing the voltage across transistor 404 from exceeding its SOA limit (which, in this example, also corresponds to 0.9V).

Figure 5:
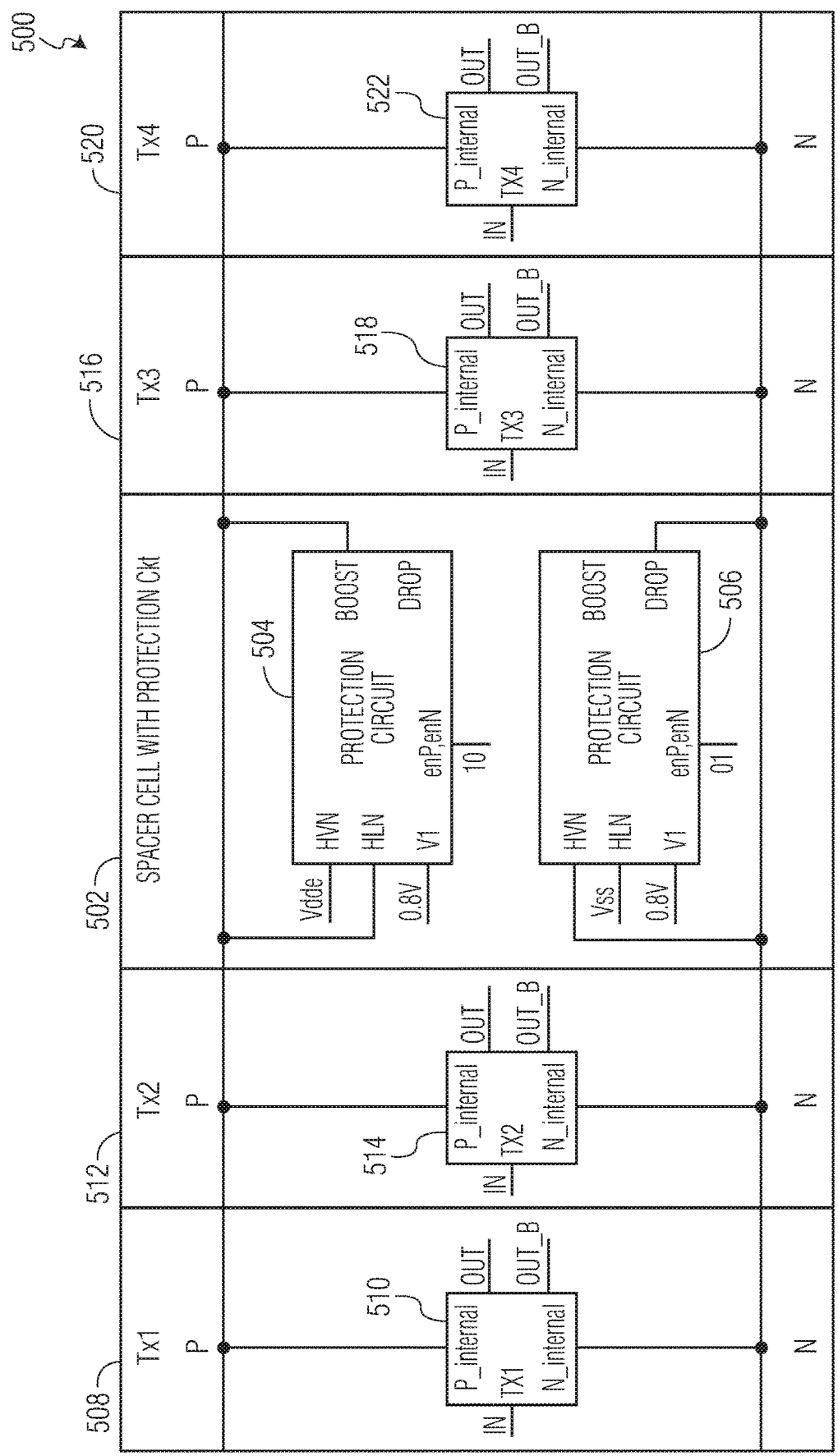
FIG. 5 illustrates, in block diagram form, a padring configuration having a plurality of transmitter cells and a spacer cell, in accordance with one embodiment of the present invention.

FIG. 5 illustrates, in block diagram form, a padring 500 having a plurality of transmitter cells, including transmitter cells 508, 512, 516, and 520, a spacer cell 502, and P and N rails extending across all the cells, in accordance with one embodiment of the present invention Spacer cell 502, located between two transmitter cells, includes a protection circuit 504 and a protection circuit 506, in which each of these protection circuits can be implemented with protection circuit 300 of FIG. 3. Each transmitter cell of padring 500 includes a transmitter circuit. Transmitter cell 508 includes a transmitter circuit 510, which may be implemented as transmitter circuit 200 of FIG. 2, and which includes enable switches such as switches 206 and 208. The P_internal node of transmitter circuit 510 is connected to the P rail of padring 500, and the N_internal node of transmitter circuit 510 is connected to the N rail of padring 500. Similarly, transmitter cell 512 includes a transmitter circuit 514, transmitter cell 516 includes a transmitter circuit 518, and transmitter cell 520 includes a transmitter circuit 522. Each of transmitter circuits 514, 518, and 522 can be implemented as transmitter circuit 200 of FIG. 2, and each includes the enable switches, such as switches 206 and 208. The P_internal nodes for these transmitter circuits are connected to the P rail of padring 500, and the N_internal nodes to the N rail of padring 500. Note that, as with transmitter circuit 200 of FIG. 2, the transmitter circuits of FIG. 5 are simplified representations of a transmitter circuit and may include additional circuitry, such as, for example, an input stage (such as input stage 102 of FIG. 1) or other additional stages or circuitry, as needed.

Protection circuit 504 can be implemented as protection circuit 300 of FIG. 3 in which enP is asserted to source a boost current to the P rail as needed. Protection circuit 506 can be implemented as protection circuit 300 of FIG. 3 in which enN is asserted to sink current from the N rail as needed. When the transmitter circuits are off (TX_ENb=1), the P and N circuit nodes of the transmitters are all shorted, via the P rail and N rail. In this manner, protection circuits 504 and 506 monitor the P and N rails and provides the necessary correction via a voltage boost or drop to all LV transistors connected to the P and N rails.

Therefore, by now it can be appreciated how a protection circuit can provide protection to transistors, such as LV transistors, by controlling the voltage across the transistor so as not to exceed the SOA limit. For example, the protection circuit includes a voltage difference detector which measures a voltage across the transistor being protected, and current source control circuit which, based on a comparison between the measured voltage and a target voltage difference, enables a current source to either increase or decrease a voltage at a node of the transistor, as needed, to ensure the measured voltage difference stays within the target voltage difference. This target voltage difference is set to a value that is less than the SOA limit, so that the voltage across the transistor does not reach a damaging level.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "b" after the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the protection circuits described herein can use different circuit configurations to measure the voltage difference between HVN and LVN and to provide a comparison of the voltage difference with a target voltage difference. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a circuit includes a device including a first node and a second node, the device operating in at least an enabled mode and a disabled mode; a voltage control circuit, including: a current source for sourcing current to or sinking current from the first node during the disabled mode; a voltage difference detector including an output for providing an indication of a measured voltage difference between the first node and the second node; a current source control circuit including a first input to receive the indication of the measured voltage difference and an output to control current sourced to or sinked from the first node by the current source to limit a voltage difference between the first node and the second node based on a comparison between the indication of the measured voltage difference and an indication of a target voltage difference received by the voltage control circuit. In one aspect of this embodiment, the current source sources current to the first node and the output of the current source control circuit controls the current sourced to the first node to limit the voltage difference between the first node and the second node. In a further aspect, the current source control circuit controls the current sourced to the first node to raise the voltage of the first node to limit a voltage difference between the first node and the second node. In another further aspect, the circuit further includes a second device, the second device including a third node and a forth node; a second voltage control circuit, including: a second current source for sinking current from the third node during the disabled mode; a second voltage difference detector including an output for providing an indication of a second measured voltage difference between the third node and the fourth node; a second current source control circuit including a first input to receive the indication of the second measured voltage difference and an output to control current sinked from the third node by the second current source to limit a voltage difference between the third node and the fourth node based on a comparison between the indication of the second measured voltage difference and an indication of a second target voltage difference received by the second voltage control circuit. In yet a further aspect, the first device and the second device are coupled in series between a first power supply terminal and a second power supply terminal. In another further aspect, the voltage control circuit further includes: a second current source for sinking current from the second node during the disabled mode; wherein the output of the current source control circuit controls current sinked from the second node by the second current source to limit the voltage difference between the first node and the second node based on a comparison between the indication of the measured voltage difference and the indication of the target voltage difference received by the voltage control circuit. In another aspect of the above embodiment, the current source sinks current from the first node and the output of the current source control circuit controls the current sinked from the first node to limit the voltage difference between the first node and the second node. In a further embodiment, the current source control circuit controls the current sinked from the first node to lower the voltage of the first node to limit a voltage difference between the first node and the second node. In another aspect of the above embodiment, the target voltage difference is less than a safe operating voltage of the device. In yet another aspect, the circuit further includes a second device including a third node and a fourth node; wherein the output of the current source control circuit controls current sourced to or sinked from the third node by the current source to limit a voltage difference between the third node and the fourth node based on a comparison between the indication of the measured voltage difference and the indication of a target voltage difference received by the voltage control circuit. In a further aspect, the first device is part of an output stage of a first transmitter and the second device is part of the output stage of a second transmitter. In another aspect, in the disabled mode, the first node and the third node are coupled together via at least a first switch that is closed, wherein in the enable mode, the first switch is open. In yet another aspect, the current source is coupled to the first node via a switch when in the disabled mode, wherein in the enabled mode, the first switch is open. In yet another aspect, the circuit includes a transmitter circuit in which the device is part of an output stage of the transmitter circuit. In another aspect, the device is characterized a field effect transistor; the first node is characterized as a drain terminal of the field effect transistor and the second node is characterized as a source terminal of the field effect transistor.

In another embodiment, a method of operating a circuit with a device including a first node and a second node, in a disabled mode, includes comparing with a current source control circuit, a measured voltage difference between the first node and the second node with a target voltage difference; controlling, with the current source control circuit, current sourced to or sinked from the first node by a current source to limit a voltage difference between the first node and the second node based on the comparing; wherein in an enabled mode, current is not sourced to or sinked from the first node by the current source. In one aspect of this another embodiment, in the disabled mode, current is sourced to the first node by the current source. In another aspect, in the disabled mode, current is sinked from the first node by the current source. In yet another aspect, the circuit includes a second device including a third node and a fourth node; the controlling further includes controlling, with the current source control circuit, current sourced to or sinked from the third node by the current source to limit a voltage difference between the third node and the fourth node based on the comparing. In another aspect, in the disabled mode, current is sourced to the first node by the current source; and in the disabled mode, the method includes: controlling, with the current source control circuit, current sinked from the second node by a second current source to limit the voltage difference between the first node and the second node based on the comparing; wherein in the enabled mode, current is not sinked from the second node by the second current source.

What is claimed is:

1. A circuit comprising:
   a device including a first node and a second node, the device operating in at least an enabled mode and a disabled mode;
   a voltage control circuit, including:
      a current source for sourcing current to or sinking current from the first node during the disabled mode;
      a voltage difference detector including an output for providing an indication of a measured voltage difference between the first node and the second node;
      a current source control circuit including a first input to receive the indication of the measured voltage difference and an output to control current sourced to or sinked from the first node by the current source to limit a voltage difference between the first node and the second node based on a comparison between the indication of the measured voltage difference and an indication of a target voltage difference received by the voltage control circuit.

2. The circuit of claim 1 wherein the current source sources current to the first node and the output of the current source control circuit controls the current sourced to the first node to limit the voltage difference between the first node and the second node.

3. The circuit of claim 2 wherein the current source control circuit controls the current sourced to the first node to raise the voltage of the first node to limit a voltage difference between the first node and the second node.

4. The circuit of claim 2 further comprising:
   a second device, the second device including a third node and a forth node;
   a second voltage control circuit, including:
      a second current source for sinking current from the third node during the disabled mode;
      a second voltage difference detector including an output for providing an indication of a second measured voltage difference between the third node and the fourth node;
      a second current source control circuit including a first input to receive the indication of the second measured voltage difference and an output to control current sinked from the third node by the second current source to limit a voltage difference between the third node and the fourth node based on a comparison between the indication of the second measured voltage difference and an indication of a second target voltage difference received by the second voltage control circuit.

5. The circuit of claim 4 wherein the first device and the second device are coupled in series between a first power supply terminal and a second power supply terminal.

6. The circuit of claim 2 wherein the voltage control circuit further includes:
   a second current source for sinking current from the second node during the disabled mode;
   wherein the output of the current source control circuit controls current sinked from the second node by the second current source to limit the voltage difference between the first node and the second node based on a comparison between the indication of the measured voltage difference and the indication of the target voltage difference received by the voltage control circuit.

7. The circuit of claim 1 wherein the current source sinks current from the first node and the output of the current source control circuit controls the current sinked from the first node to limit the voltage difference between the first node and the second node.

8. The circuit of claim 7 wherein the current source control circuit controls the current sinked from the first node to lower the voltage of the first node to limit a voltage difference between the first node and the second node.

9. The circuit of claim 1 wherein the target voltage difference is less than a safe operating voltage of the device.

10. The circuit of claim 1 further comprising:
    a second device including a third node and a fourth node;
    wherein the output of the current source control circuit controls current sourced to or sinked from the third node by the current source to limit a voltage difference between the third node and the fourth node based on a comparison between the indication of the measured voltage difference and the indication of a target voltage difference received by the voltage control circuit.

11. The circuit of claim 10 wherein the first device is part of an output stage of a first transmitter and the second device is part of the output stage of a second transmitter.

12. The circuit of claim 10 wherein in the disabled mode, the first node and the third node are coupled together via at least a first switch that is closed, wherein in the enable mode, the first switch is open.

13. The circuit of claim 1 wherein the current source is coupled to the first node via a switch when in the disabled mode, wherein in the enabled mode, the first switch is open.

14. The circuit of claim 1 including a transmitter circuit, the device is part of an output stage of the transmitter circuit.

15. The circuit of claim 1 wherein:
the device is characterized a field effect transistor;
the first node is characterized as a drain terminal of the field effect transistor and the second node is characterized as a source terminal of the field effect transistor.

16. A method of operating a circuit with a device including a first node and a second node, the method comprising:
in a disabled mode, the method includes:
comparing with a current source control circuit, a measured voltage difference between the first node and the second node with a target voltage difference;
controlling, with the current source control circuit, current sourced to or sinked from the first node by a current source to limit a voltage difference between the first node and the second node based on the comparing;
wherein in an enabled mode, current is not sourced to or sinked from the first node by the current source.

17. The method of claim 16 wherein in the disabled mode, current is sourced to the first node by the current source.

18. The method of claim 16 wherein in the disabled mode, current is sinked from the first node by the current source.

19. The method of claim 16 wherein:
the circuit includes a second device including a third node and a fourth node;
the controlling further includes controlling, with the current source control circuit, current sourced to or sinked from the third node by the current source to limit a voltage difference between the third node and the fourth node based on the comparing.

20. The method of claim 16 wherein:
wherein in the disabled mode, current is sourced to the first node by the current source;
in the disabled mode, the method includes:
controlling, with the current source control circuit, current sinked from the second node by a second current source to limit the voltage difference between the first node and the second node based on the comparing;
wherein in the enabled mode, current is not sinked from the second node by the second current source.

* * * * *